US011019751B2

(12) United States Patent
Grau et al.

(10) Patent No.: US 11,019,751 B2
(45) Date of Patent: May 25, 2021

(54) ACTIVATE LOADING MECHANISM

(71) Applicant: Intel Corporation, Santa Clara, CA (US)

(72) Inventors: Iwan Ricardo Grau, Queen Creek, AZ (US); Erich Nolan Ewy, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/832,576

(22) Filed: Mar. 27, 2020

(65) Prior Publication Data

US 2020/0229318 A1 Jul. 16, 2020

(51) Int. Cl.
*H05K 7/20* (2006.01)
*H01L 23/40* (2006.01)

(52) U.S. Cl.
CPC ........... *H05K 7/2039* (2013.01); *H01L 23/40* (2013.01)

(58) Field of Classification Search
CPC ........ H01L 23/40; H05K 7/2039; H05K 7/20; H05K 1/0203; H05K 1/181; H05K 2201/10159; H05K 2201/10265; H05K 2201/10378; H05K 2201/10409; H05K 2201/10734; H05K 2201/0308; F28F 2013/006
USPC ........................................................ 361/719
See application file for complete search history.

(56) References Cited

U.S. PATENT DOCUMENTS

| 6,672,892 B2 | 1/2004 | Chandran et al. |
| 2003/0097839 A1 | 5/2003 | Yazawa et al. |
| 2005/0277324 A1* | 12/2005 | Gates ...................... G06F 1/183 |
| | | 439/487 |
| 2010/0129648 A1 | 5/2010 | Xu et al. |
| 2019/0004603 A1* | 1/2019 | Longo ................. G06F 3/03543 |
| 2019/0246488 A1 | 8/2019 | Kuklinski et al. |

FOREIGN PATENT DOCUMENTS

| CN | 111755398 A | 10/2020 | |
| EP | 0334708 A1 | 9/1989 | |
| EP | 3716745 A1 | 9/2020 | |
| FR | 2880192 A1 | 6/2006 | |
| WO | WO-2006070121 A1 * | 7/2006 | ......... H01L 23/3677 |

OTHER PUBLICATIONS

English translation of Suard Nicolas, 2006.*

(Continued)

*Primary Examiner* — Mandeep S Buttar
(74) *Attorney, Agent, or Firm* — Patent Capital Group

(57) ABSTRACT

Particular embodiments described herein provide for an electronic device that can be configured to enable an active loading mechanism. The electronic device can include a heat source, a heat sink over the heat source, and an active loading mechanism coupled to the heat sink, where the heat sink is thermally decoupled from the heat source when the active loading mechanism is not activated and the heat sink is thermally coupled to the heat source when the active loading mechanism is activated. In an example, the active loading mechanism includes shape memory material and the shape memory material is activated when a temperature of the heat source satisfies a threshold temperature.

19 Claims, 10 Drawing Sheets

(56) References Cited

OTHER PUBLICATIONS

USPTO Non-Final Office Action issued in U.S. Appl. No. 16/370,506 dated Feb. 19, 2020; 11 pages.
USPTO Restriction Requirement issued in U.S. Appl. No. 16/370,506 dated Dec. 6, 2019; 5 pages.
USPTO Final Office Action issued in U.S. Appl. No. 16/370,506 dated Jun. 1, 2020; 9 pages.
European Extended Search Report issued in EP Application No. 20 154 196.8 dated Jul. 21, 2020; 51 pages.
USPTO Notice of Allowance issued in U.S. Appl. No. 16/370,506 dated Sep. 1, 2020; 17 pages.

* cited by examiner

ACTIVATE LOADING MECHANISM

TECHNICAL FIELD

This disclosure relates in general to the field of computing and/or device cooling, and more particularly, to an activate loading mechanism.

BACKGROUND

Emerging trends in systems place increasing performance demands on the system. The increasing demands can cause the system to operate in a cold environment where it can be difficult to bring the system or portions of the system (e.g., a processor) up to an operating temperature. The increasing demands can also cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
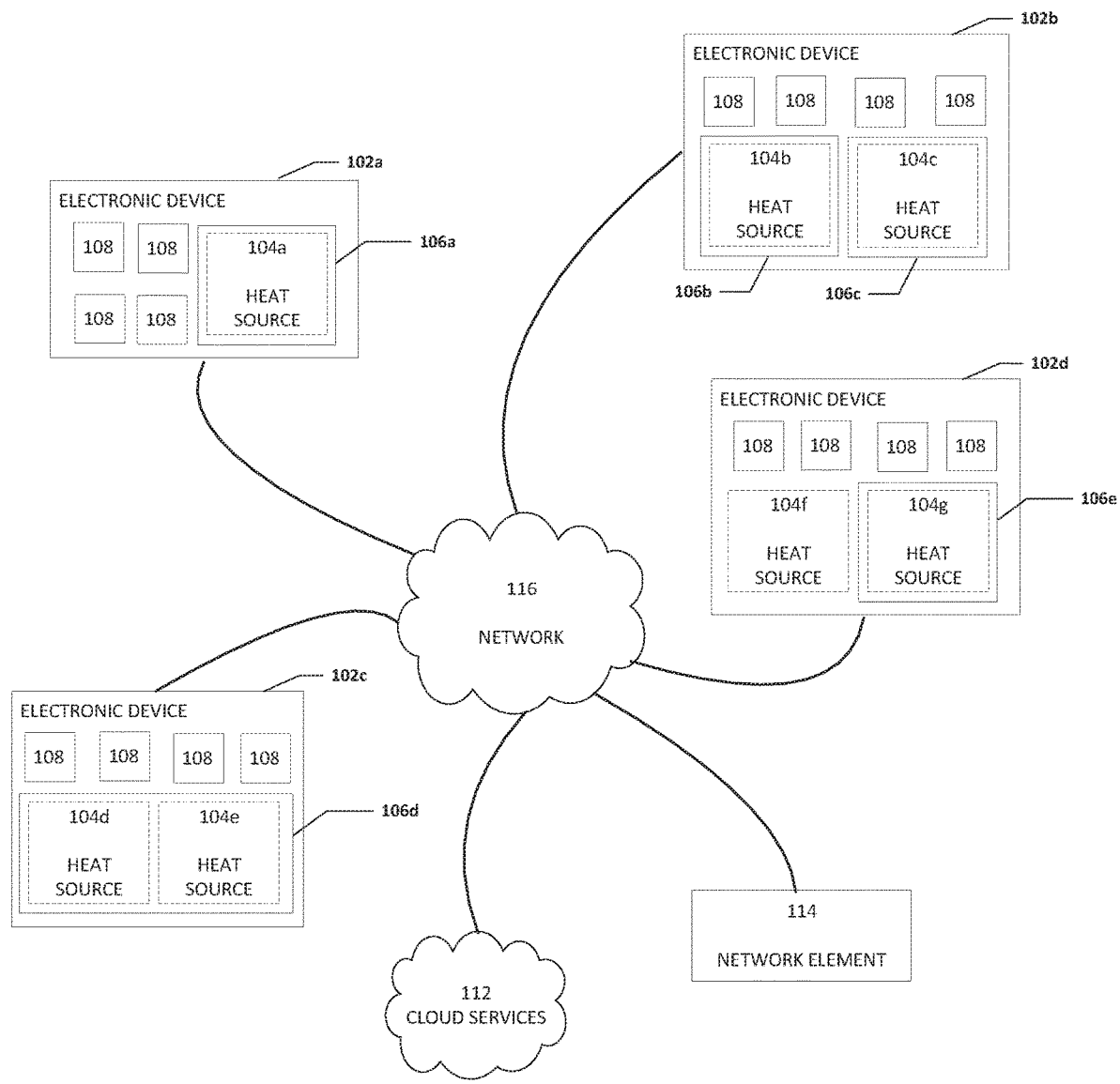
FIG. 1 is a simplified block diagram of a system to enable an active loading mechanism, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling an active loading mechanism. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

FIG. 1 is a simplified block diagram of an electronic device configured with an active loading mechanism, in accordance with an embodiment of the present disclosure. In an example, an electronic device can include one or more heat sources. Each of the one or more heat sources may have a corresponding heat sink. For example, as illustrated in FIG. 1, electronic device 102a includes heat source 104a, a corresponding heat sink 106a, and one or more electronics 108. In addition, electronic device 102b includes heat sources 104b and 104c, corresponding heat sinks 106b and 106c respectively, and one or more electronics 108. Also, electronic device 102c includes heat sources 104d and 104e, heat sink 106d, and one or more electronics 108. Heat sink 106d can correspond to both heat sources 104d and 104e. Further, electronic device 102d includes heat sources 104f and 104g, heat sink 106e, and one or more electronics 108. Heat source 104f may not have a corresponding heat sink and heat sink 106e may correspond to heat source 104g. Each of electronic devices 102a-102d may be in communication with each other, cloud services 112, and/or network element 114 using network 116. In some examples, one or more of electronic device 102a-102d may be standalone devices and not connected to network 116 or another device.

Each of heat sources 104a-104g may be a heat generating device (e.g., processor, logic unit, field programmable gate array (FPGA), chip set, integrated circuit (IC), a graphics processor, graphics card, battery, memory, or some other type of heat generating device). Each of heat sinks 106a-106e can be configured as a thermal cooling device to help remove thermal energy from one or more corresponding heat sources (e.g., heat sink 106a corresponds to heat source 104a, heat sink 106d corresponds to both heat sources 104d and 104e, etc.). Each of heat sinks 106a-106e may be a passive cooling device or an active cooling device to help reduce the thermal energy or temperature of one or more corresponding heat sources. Each of electronics 108 can be a device or group of devices available to assist in the operation or function of the electronic device that includes electronics 108.

In a cold environment, the system can be configured to reduce the thermal mass of a heat source to help allow the heat source, system, and/or a portion of the system, to heat up relatively quickly because the thermal mass or portions of the system that need to be heated are reduced and generally, a small thermal mass can be heated more quickly than a larger thermal mass. The term "cold environment" includes an environment where the ambient temperature and/or the temperature of the heat source is below the minimum recommended operating temperature or minimum operating temperature of the heat source. For example, many processors have a recommend operating temperature above zero degrees Celsius so the cold environment for those processors would be where the ambient temperature and/or temperature of the heat source is below zero degrees Celsius. The term "thermal mass" includes the ability of a heat source to absorb heat energy. The higher the thermal mass, the more energy that is required to heat the heat source to a desired temperature (e.g., a minimum operating temperature of the heat source). More specifically, a heat source thermally coupled to a heat sink can have a relatively large thermal mass because the heat sink can transfer or dissipate heat from the heat source and more energy is required to heat the heat source. A heat source that is not thermally coupled to, or thermally decoupled from a heat sink will have a relatively small thermal mass because the heat generated by the heat source cannot be readily transferred or dissipated to the heat sink and then away from the heat source and less energy is required to heat the heat source. The phrase "heat source thermally coupled to a heat sink" and its derivatives (e.g., thermally couple the heat sink . . . , thermally coupling the heat sink . . . , etc.) includes the ability of the heat sink to relatively easily draw, transfer, etc. thermal energy or heat away from the heat source. The phrase "thermally decoupled" and its derivatives (e.g., thermally decouple, thermally decoupling, etc.) includes a configuration where the heat generated by the heat source cannot be relatively easily, readily, etc. transferred or dissipated to the heat sink and away from the heat source. The phrase "thermally decoupled" and its derivatives does not include a configuration where the heat sink is isolated or perfectly insulated from the heat source as a relatively small amount of heat can be transferred from the heat source to the heat sink.

When a system is in a cold environment, the system may not operate properly, operate within a specification range, or be stable because most capacitors do not work properly when the temperature is below a threshold. In addition, when a system is in a cold environment, condensation can also be an issue. Most current systems do not reduce the thermal mass of a heat source in cold environments. When the silicon, processor, etc. is in a cold environment, the cold temperature can cause an increase in the power up time of the system. Reduction of the thermal mass can help to allow for speeding up of the heating of the heat source in cold environments, especially for automotive and surveillance applications.

The thermal mass can be reduced by means of a thermally driven event, for example, a heat sink (e.g., heat sink 106*a*) with an active loading mechanism. More specifically, when the system is in a cold environment, the active loading mechanism may be in a configuration that allows a gap to be created between the heat source (e.g., heat source 104*a*) and the heat sink (e.g., heat sink 106*a*) and to thermally decouple the heat sink from the heat source. In an example, the gap is greater than about 0.5 millimeters. In another example, the gap is greater than about one (1) millimeter. In some examples, the gap is less than about 1.5 millimeters. In still other examples, the gap is between about 0.5 millimeters and about two (2) millimeters. This reduces the thermal mass of the heat source and allows the heat source to heat up relatively quickly because the heat sink is not drawing heat or thermal energy away from the heat source and, in a cold environment, less energy is required to heat the heat source to an operating temperature.

When the heat source is no longer in the cold environment and a temperature of the heat source reaches a threshold (e.g., a minimum operating temperature), a shape memory material in the active loading mechanism can be activated and change shape. The shape change of the shape memory material can create an applied load to the heat source and/or the structure that supports the heat source. The applied load can help close the gap between the heat source and the heat sink and allow the system to help draw heat or thermal energy away from the heat source and cool the heat source.

In a specific example, the heat source may be an integrated circuit (IC) on a printed circuit board (PCB). The active loading mechanism can include a shape memory material and a heat sink that can apply a load on the heat source in response to applied heat or an applied electrical current. When heat or an electrical current is applied, the shape memory material changes shape and forces the heat sink onto the heat source. The load that is applied is based on the material used and depends on the form factor of the device that includes the active loading mechanism. The load may be one pound of load or less to more than one hundred pounds of load and depends on the shape memory material used, form factor, design constraints, etc.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. Further, the appearances of the phrase "in one example" or "in an example" are not necessarily all referring to the same examples.

Elements of FIG. 1 may be coupled to one another through one or more interfaces employing any suitable connections (wired or wireless), which provide viable pathways for network (e.g., network 116, etc.) communications. Additionally, any one or more of these elements of FIG. 1 may be combined or removed from the architecture based on particular configuration needs. Network 116 may include a configuration capable of transmission control protocol/Internet protocol (TCP/IP) communications for the transmission or reception of packets in a network. Each of electronic devices 102*a*-102*d* may also operate in conjunction with a user datagram protocol/IP (UDP/IP) or any other suitable protocol where appropriate and based on particular needs.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems. This is especially true for cold environments.

Some systems that are used in cold environments require the usage of relatively expensive materials that are purpose built for the cold environment. Other systems may create micro environments that are heated in an effort to move the system or specific system components to a warmer supported temperature range. Still other systems simply may not even support cold environment implementations.

For example, when an electronic device will be operated in a cold environment, some systems create micro environments that are heated in an effort to move system or system components, including heat sinks, to a warmer, supported temperature range. However, significant power may be required to heat the micro environment in systems or micro environments of an electronic device. Some systems that include a micro environment require an increase in power up time. Also, the micro environment can cause design constraint issues because of the additional space some micro environments require. Some systems required the usage of relatively expensive parts that are designed to operate in the cold environment. However, some of these systems have absolute temperature limits for implementations and when the system begins to heat up, the elements that are designed to operate in the cold environment do not function as needed. What is needed is a system and method to reduce the thermal mass in cold environments, increase the thermal mass when needed, increase the thermal load on a heat source when needed, and/or decrease the thermal load when it is not needed A system to enable an active loading mechanism, as outlined in FIG. 1, can resolve these issues (and others). In an example, an active loading mechanism can be constructed using a shape memory material. The shape memory material can enable the use of heat from a heat source or an electrical signal to trigger a reversible shape change of the shape memory material in the active loading mechanism. The shape change of the shape memory material in the active loading mechanism can allow for an increase or decrease in the heat sink load on the heat source and a change of the thermal mass of the heat source. The shape memory material functions as a mechanical throttle, temporarily increasing the heat sink load on the heat source, and thereby increasing the thermal mass and heat flux out of the heat source during periods of operation above a threshold temperature (e.g., a minimum operating temperature of the heat source) and/or during periods of operation during high workload and later, decreasing the heat sink load on the heat source when the temperature is below a threshold temperature and/or the workload subsides. More generally, the active loading mechanism can encompass a wide class of devices that can be designed to use external or resistive heating and to attach thermal solutions to SoCs and/or to control the thermal solution load once it is assembled.

By not having the heat sink thermally coupled to the heat source when the heat source is in a cold environment and the temperature is below a threshold temperature, the thermal mass of the heat source can be reduced while the heat source is in the cold environment. More specifically, an automatic thermo-mechanical apparatus based on bi-metal thermal expansion and contraction properties can be configured to help physically detach the heat sink from the heat source when the heat source is in a cold environment and is below a threshold temperature and therefore reduce the thermal mass of the heat source. By reducing the thermal mass of a heat source, the heat source, system, and/or a portion of the system can be allowed to heat up relatively quickly because the heat sink is not thermally coupled to the heat source and the heat sink cannot dissipate or transfer heat from the heat source.

The thermo-mechanical apparatus can be an automated, no power required, and relatively highly reliable apparatus to reduce the thermal mass in cold environments. This can help to speed up the heating of the heat source in extended temperature cold environments (e.g., automotive and surveillance systems). In addition, this can help to preserve the vital cooling benefits of heat sinks in hot environments. In an example, the system can include an automatic thermo-mechanical apparatus based on bi-metal thermal expansion and contraction properties to physically detach the heat sink from the heat source when environmental temperatures are below a threshold temperature, thus greatly reducing the thermal mass that needs to be heated. This allows the system to quickly heat only the die or heat source without the full heat sink's thermal mass.

In some examples, the system can be automatic and not require power nor sensing logic to operate and instead rely on principles of physics. The system is low cost compared to current alternatives like creating a micro environment and can allow standard temperature products to be used in extended cold temperature environments. The system is scalable and can reduce system level heating power requirements and decrease boot time as compared to full system temperature control solutions.

In one example, the use of dissimilar metals can be used to create thermo-mechanical movement, which at temperatures nearing and below a cold environment associated with a heat source (e.g., zero degrees Celsius) can engage the heat sink to push the heat sink away from the die or heat source and thus create an air gap. This greatly reduces the mass that needs to be heated to or above the minimum operating temperature of the heat source. In a specific example, bimetallic pushing counteracts the typical spring force used to ensure the heat sink is contacting the heat source to ensure efficient heat conduction from the heat source to the heat sink. The mechanical separation and reattachment are relatively gentle in nature and consume no electricity as it can be a passive effect that is solely temperature controlled. The separation distance at the coldest temperature can be minimal (e.g., less than 1 millimeter, less than two millimeters, etc.) and only needs to be enough to ensure the heat sink loses contact at the minimum operating temperature of the heat source (e.g., zero degrees Celsius) and below to create an air gap and thus greatly reduce the thermal mass that needs to be heated. There is no precise engagement or disengagement temperature and it can be above or below zero degrees Celsius. Another embodiment could be to use heat pipes that can restrict the flow of thermal transfer fluid and this could be done with a bimetal in an automated valve. The key is that the thermal mass is reduced by means of a relatively reliable thermally driven event.

When using standard temperature rated silicon in a cold environment, the temperature of a "cold boot" event can be about twenty (20) to about forty (40) degrees Celsius lower than rated minimum Tj. The quickest way to heat the silicon is self-heat. One approach is to hold the silicon in RESET and another may be to devise a self-heat power virus. Once the silicon reaches minimum Tj, the silicon resets formally and begins the boot sequence. Both of these approaches will dissipate less than the thermal design power (TDP) or thermal design point of the heat source. The time to heat up and boot a processor in a cold environment is greatly exacerbated by a heat sink thermally coupled to the heat source because the heat sink will draw the heat away from the heat source. As a result, the time to heat up the heat source and/or system can take hours if it happens at all. One way to circumvent the time-to-boot issue is to thermally decouple the heat sink from the heat source for a cold boot. This effectively removes the mass of the heat sink and the heat-up time is governed by the pre-boot power dissipation and package mass.

In a specific illustrative example, when a heat sink is attached to a processor, the junction temperature of the processor will never reach the zero degrees Celsius boot temperature. If the heat sink is detached or thermally decoupled from the processor, then the time to reach boot temperature may be two and a half minutes or less. To achieve the detachment or mechanical decoupling, a bimetallic spring element may be used. The bimetallic spring will have a much higher k-value (stiffness) at cold temperatures and work "against" the typical load springs at sub-zero temperatures, slightly lifting the heat sink off of the processor. The actuation height of the bimetallic spring element may be designed in such a way to provide a relatively low distance (e.g., one (1) mm) to physically separate the heat sink from the package/TIM at the minimum boot temperature. The bimetallic spring element may be an active loading mechanism with a shape memory material.

Once the processor begins to heat up, the heat sink needs to reengage or thermally coupled with the processor to prevent an over-heat condition. In a specific example, this is achieved by a bimetallic spring cap. The bimetallic spring cap is always in direct contact with the processor. As the processor heats up, it also heats the bimetallic spring cap and through conduction, the bimetallic spring in the bimetallic spring cap begins to heat and therefore "relax" as temperature increases. As the bimetallic spring cap relaxes, the counter load of coil springs come into effect and close the gap, getting to full contact pressure as temperatures continue to rise to normal operating temperatures. During lifetime operation, the number of cold boot events can vary depending on end-use application. The thermal interface material (TIM) between the heat sink and bimetallic spring cap can have the capability to work under loaded and unloaded conditions (e.g., Indium metal TIM, etc.).

Once a system moves from the cold environment condition, or a heat source is sufficiently heated or warmed up, one current way thermal performance targets are typically achieved is by decreasing the thermal resistance between the SoC and the thermal solution. The thermal resistance between the SoC and the thermal solution is typically decreased by either increasing the thermal solution load on the SoC, which can increase the BGA solder joint failure risk, or by using a TIM that exhibits reduced thermal resistance for the same pressure, which may be nearing a point of diminishing returns for state-of-the-art grease TIMs, and/or can be cost-prohibitive for high volume manufacture for fundamentally new classes of TIMs (e.g., liquid metal).

In some current systems, the thermal performance targets may be achieved by increasing the thermal capacitance of the system in the vicinity of the SoC. The increase in the thermal capacitance of the system in the vicinity of the SoC is typically achieved by increasing the thickness of a cold plate or spreader, which can have a direct impact on the overall system thickness. However, these current solutions generate a constant load on the SoC during all operating conditions, including cold environment conditions.

One shared trait among most current thermal solution systems is that the thermal solution itself is designed to generate a constant load on the SoC during all operating conditions of the device. By contrast, the active loading mechanism can introduce the ability to adjust the heat sink load on the heat source up or down in response to temporary spikes in temperature at specific locations. This enables system designers to implement a deliberate, tuned balance between transient thermal needs and long-term product reliability. The tuning can occur by virtue of the shape memory effect (SME) or shape memory "temperatures" that are selected for the shape memory material. The SME occurs at an "$A_F$" temperature, which is controlled via small changes in material composition. The $A_F$ can be set anywhere from about negative twenty (−20) degrees Celsius to about one hundred and ten (110) degrees Celsius, with a tolerance of plus or minus one (±1) degree Celsius. The heat source itself is thus a feasible heat source to activate the shape memory material.

One type of shape memory material is Nickel-Titanium alloy ("Nitinol"). During the SME, Nitinol transforms from a martensitic phase to an austenitic phase. This change starts at the $A_s$ temperature and is completed at the $A_F$ or "transition" temperature. Due to this phase change, the Young's modulus increases by a factor of around 2.5. In a specific example, a thermal solution for a thin, mobile client system uses four dedicated leaf springs as a loading mechanism. The heat source loading can be achieved by using a typical leaf spring size at two common thicknesses and the resulting load increases when the spring is heated and transforms from martensite to austenite. The increases (from about 5 lbf to about 12 lbf and from around 3 lbf to about 7 lbf) can be configured to fall in the load ranges needed to balance the competing demands of thermal challenges with board BGA solder joint reliability.

Traditional grease TIMs have been known to "pump out" of the interface between the die and the thermal solution during conditions of extreme temperature cycling, causing a catastrophic increase in thermal resistance. This phenomenon is difficult to predict analytically and is thought to occur due to a mismatch between the coefficients of thermal expansion (CTE) for the various materials in the design (e.g., copper cold plate, polymer TIM, silicon die, laminate substrate, solder BGA, etc.). As a result, grease TIMs may not be well-suited for use with the active loading mechanism. However, other classes of commercial, high-performance TIMs exist that do not exhibit this failure mode, such as curing polymer TIMs and metal foil TIMs.

Turning to the infrastructure of FIG. 1, network 116 represents a series of points or nodes of interconnected communication paths for receiving and transmitting packets of information. Network 116 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 116, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic devices 102a-102d are meant to encompass a computer, a personal digital assistant (PDA), a laptop or electronic notebook, a cellular telephone, an iPhone, an IP phone, network elements, network appliances, servers, routers, switches, gateways, bridges, load balancers, processors, modules, or any other device, component, element, or object that includes a heat source that may be operated in a cold environment. Each of electronic devices 102a-102d may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102a-102d may include virtual elements.

In regards to the internal structure, each of electronic devices 102a-102d can include memory elements for storing information to be used in the operations outlined herein. Each of electronic devices 102a-102d may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

Additionally, each of heat sources 104a-104g may be or include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2:
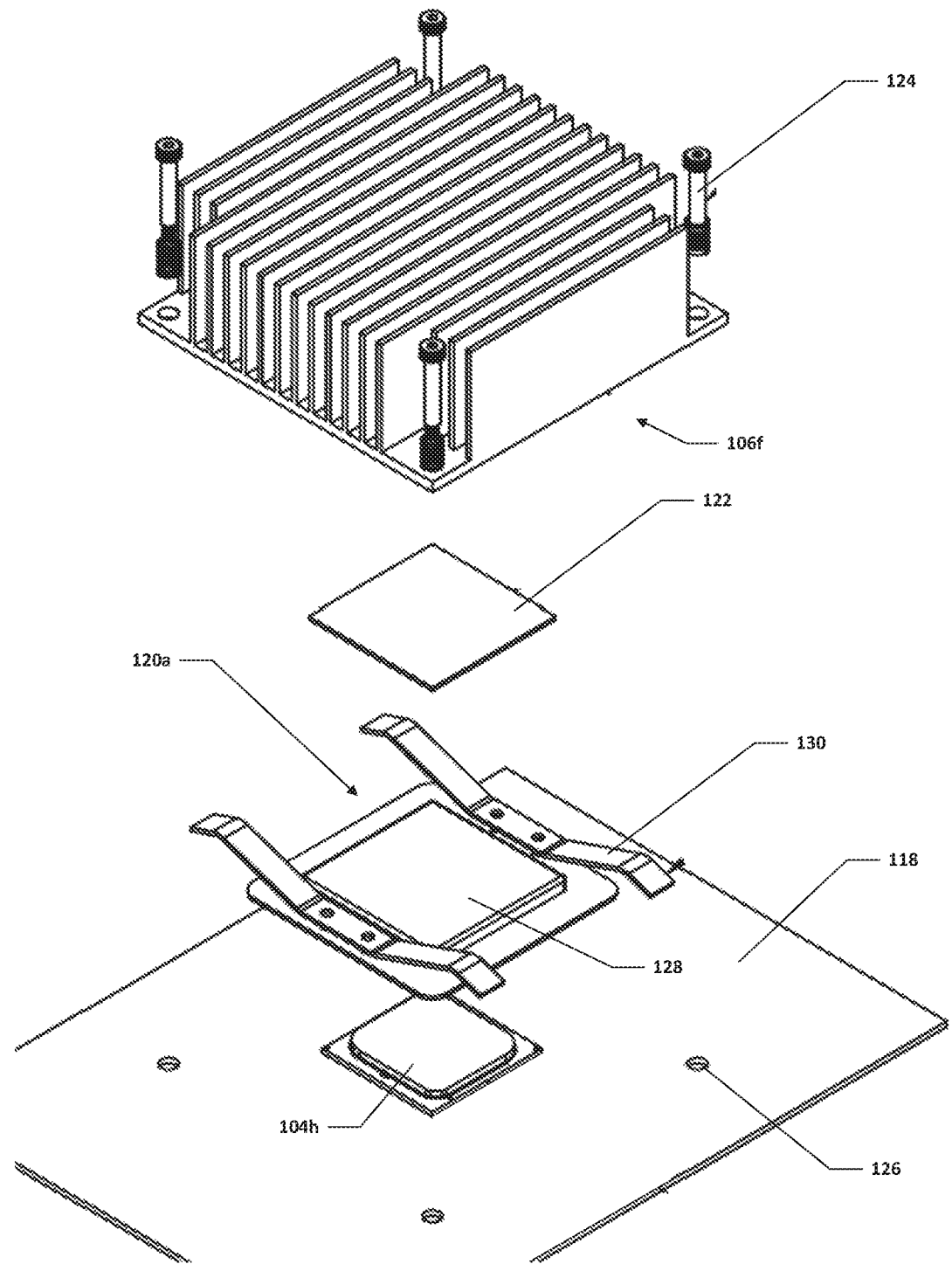
FIG. 2 is a simplified block diagram of a system to enable an active loading mechanism, in accordance with an embodiment of the present disclosure.

Turning to FIG. 2, FIG. 2 is a simplified exploded view of a heat sink 106f over a heat source 104h. As illustrated in FIG. 2, an active loading mechanism 120a can be between heat sink 106f and heat source 104h. In an example, a thermal interface material (TIM) 122 can be between active loading mechanism 120a and heat sink 106f.

Shoulder screw and spring 124 can help couple heat sink 106f to PCB 118. PCB can include coupling means 126 for coupling with shoulder screw and spring 124. Active loading mechanism 120a can include a main body 128 and extensions 130. Heat source 104h can be over or on PCB 118. Main body 128 and extensions 130 can be comprised of shape memory material. In an example, main body 128 is comprised of shape memory material and extensions 130 are comprised of a different material. Extensions 130 can have a memory shape where extensions 130 are biased upwards to help thermally decouple heat sink 106f from heat source 104h. When heat source 104h heats up, heat sink 106f needs to reengage or thermally coupled with heat source 104h to help prevent an over-heat condition. Main body 128 can be in contact with heat source 104h such that when heat source 104h heats up, main body 128 and through conduction, extensions 130 also heat up. As extensions 130 heat up, they draw or pull heat sink 106f towards heat source 104h and close the gap between heat source 104h and heat sink 106f and allow heat sink 106f to couple with heat source 104h and draw heat or thermal energy from heat source 104h.

Figure 3A:
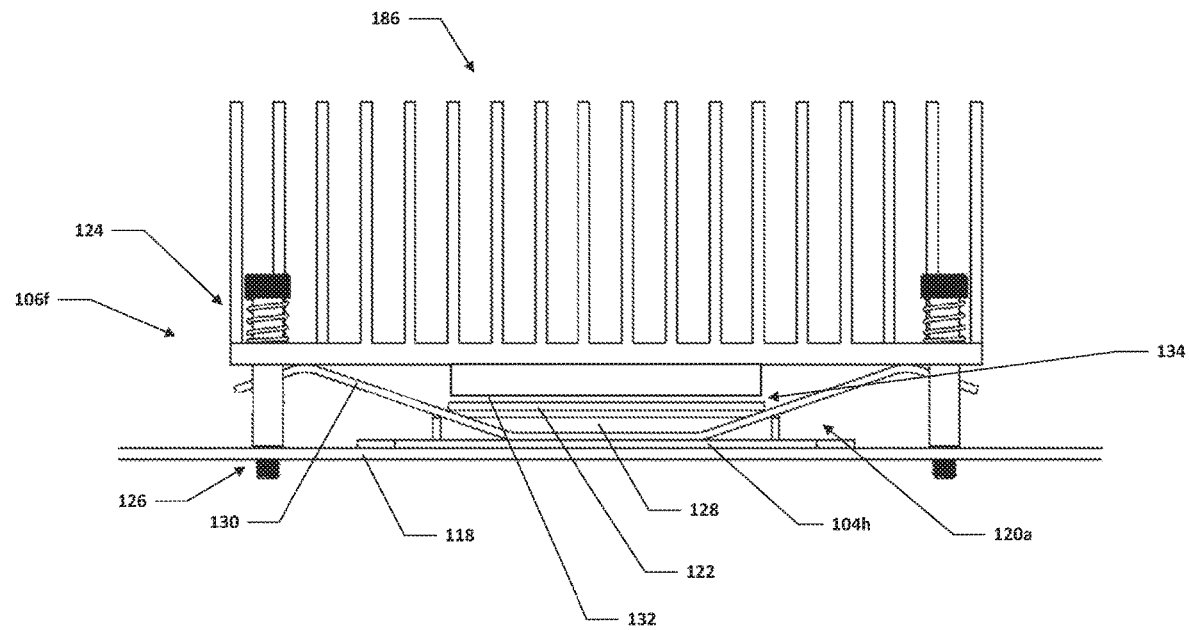
FIG. 3A is a simplified block diagram of a system to enable an active loading mechanism, in accordance with an embodiment of the present disclosure.

Turning to FIG. 3A, FIG. 3A is a simplified block diagram of heat sink 106f over heat source 104h. In an example, heat source 104h can be on a substrate 142. Substrate 142 can be coupled to a PCB (not shown) using solder balls (not shown). Active loading mechanism 120a can be over heat source 104h. Active loading mechanism 120a can include main body 128 and extensions 130. TIM 122 can be over active loading mechanism 120a. Shoulder screw and spring 124 can coupled with coupling means 126 to help couple heat sink 106f to PCB 118. Heat sink 106l can include a cold plate 132 and cooling fins 186.

As illustrated in FIG. 3A, when active loading mechanism 120a is not activated, for example, when the system is in a cold environment and a temperature of heat source 104h is below a minimum operating temperature of heat source 104h, a gap 134 is created between heat sink 106l and TIM 122. Gap 134 helps to thermally decouple heat sink 106l from heat source 104h and thereby reduce the thermal mass of the system. In an example, gap 134 is greater than about 0.5 millimeters. In another example, gap 134 is greater than about one (1) millimeter. In some examples, gap 134 is less than about 1.5 millimeters. In still other examples, gap 134 is between about 0.5 millimeters and about two (2) millimeters. This allows heat source 104h to heat up relatively quickly because heat sink 106f is not drawing heat or thermal energy away from heat source 104h.

Figure 3B:
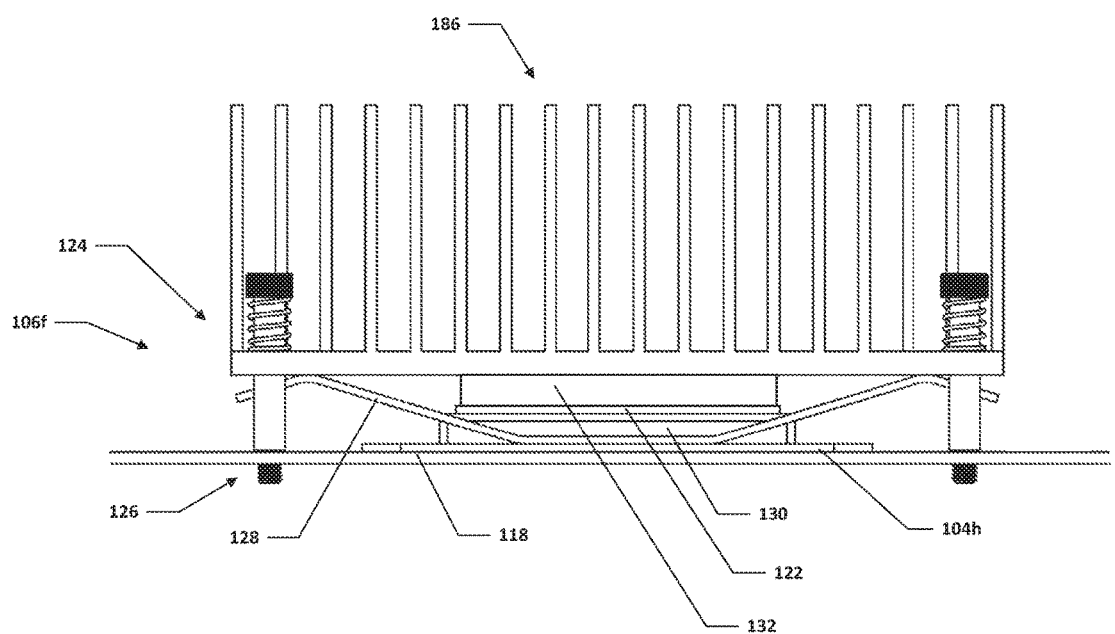
FIG. 3B is a simplified block diagram of a system to enable an active loading mechanism, in accordance with an embodiment of the present disclosure.

Turning to FIG. 3B, FIG. 3B is a simplified block diagram of heat sink 106f over heat source 104h. In an example, heat source 104h can be on a substrate 142. Substrate 142 can be coupled to a PCB (not shown) using solder balls (not shown). Active loading mechanism 120a can be over heat source 104h. Active loading mechanism 120a can include main body 128 and extensions 130. TIM 122 can be over active loading mechanism 120a. Shoulder screw and spring 124 can couple with coupling means 126 to help couple heat sink 106f to PCB 118. Heat sink 106f can include cooling fins 186.

As illustrated in FIG. 3B, when heat source 104h heats up to a minimum operating temperature of heat source 104h, gap 134 can be closed or eliminated to help couple heat sink 106f to heat source 104h and help remove heat from heat source 104h to help prevent an over-heat condition. When heat source 104h heats up, main body 128, in contact with heat source 104h, heats up and through conduction, extensions 130 also heats up. As extensions 130 heat up, they draw or pull heat sink 106f towards heat source 104h and close gap 134 between heat source 104h and heat sink 106f and allow heat sink 106f to couple with heat source 104h and draw heat or thermal energy from heat source 104h and cool heat source 104h. When heat source 104h reenters a cold environment or a temperature of heat source 104h is below a minimum operating temperature of heat source 104h, extensions 130 can cool down and gap 134 can again be created.

Figure 4A:
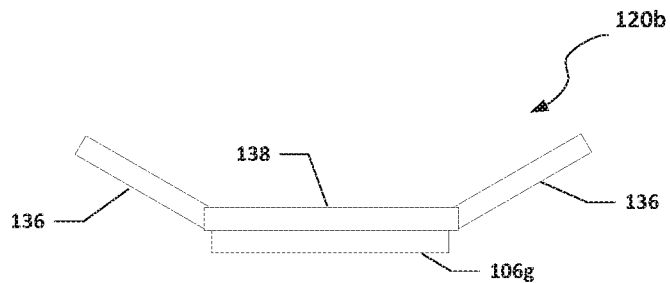
FIG. 4A is a simplified block diagram of a portion of a system to enable an active loading mechanism, in accordance with an embodiment of the present disclosure.

Turning to FIG. 4A, FIG. 4A is a simplified block diagram of an activate loading mechanism 120b. As illustrated in FIG. 4A, active loading mechanism 120b can include extensions 136, a main body 138, and a heat sink 106g. Extensions 136 and main body 138 can be comprised of shape memory material. In an example, extensions 136 are comprised of shape memory material and main body 138 is comprised of a different material. Active loading mechanism 120b can have a memory shape where extensions 136 are biased upwards (the shape illustrated in FIG. 4A). When active loading mechanism 120b is deformed (e.g., as illustrated in FIGS. 4C and 5A) and then heated, active loading mechanism 120b will try to return to the shape illustrated in FIG. 4A.

Figure 4B:
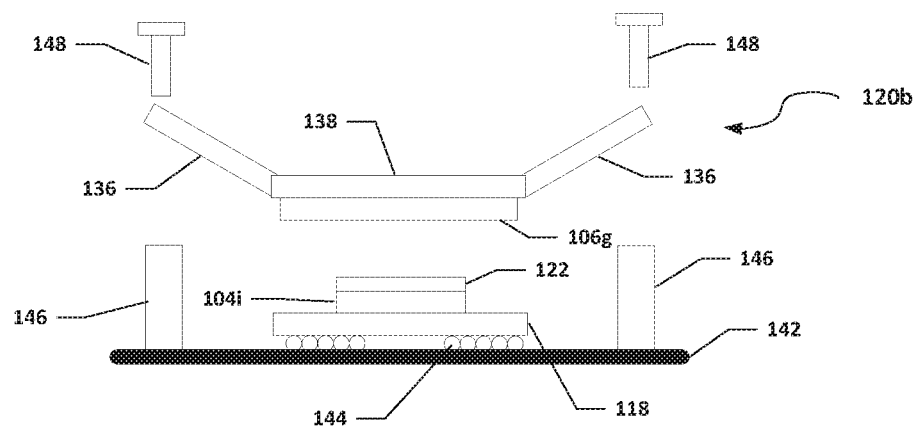
FIG. 4B is a simplified block diagram of a system to enable an active loading mechanism, in accordance with an embodiment of the present disclosure.
Figure 4C:
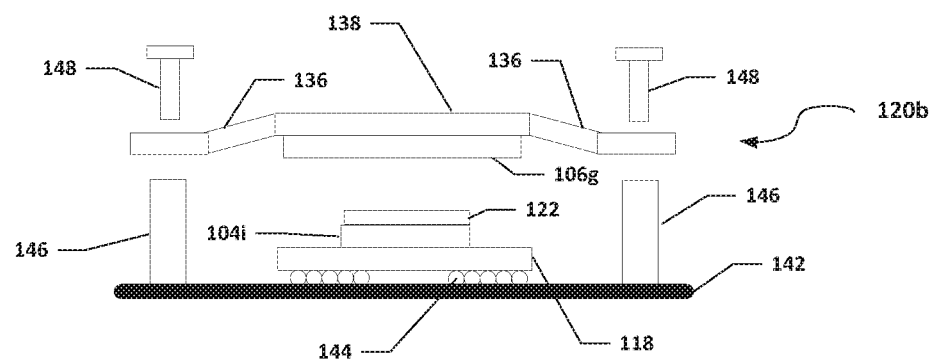
FIG. 4C is a simplified block diagram of a system to enable an active loading mechanism, in accordance with an embodiment of the present disclosure.

Turning to FIGS. 4B and 4C, FIGS. 4B and 4C are a simplified block diagram of activate loading mechanism 120b being secured to PCB 118 and over a heat source 104i. A TIM 122 can be applied over heat source 104i. In some examples, TIM 122 can have a thickness of about thirty (30) μm. Heat source 104i can be over substrate 142. Substrate 142 can be coupled to PCB 118 using one or more solder balls 144 or some other means to couple substrate 142 to PCB 118. PCB 118 can include secure posts 146. Secure posts 146 can couple with securing mechanisms 148 to help secure active loading mechanism 120b (and heat sink 106g) over heat source 104i.

Figure 5A:
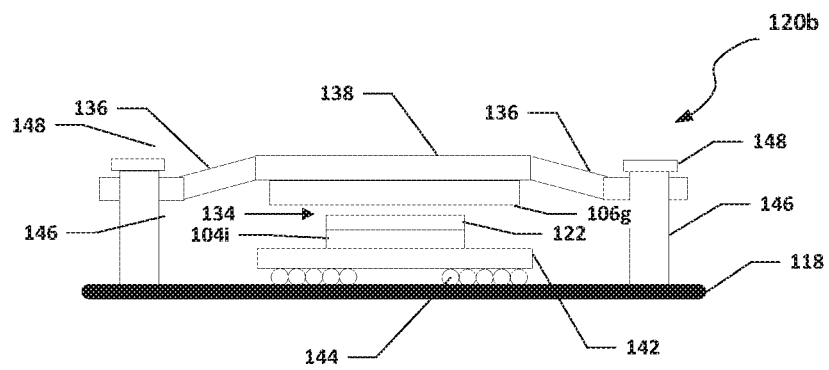
FIG. 5A is a simplified block diagram of a system to enable an active loading mechanism, in accordance with an embodiment of the present disclosure.

Turning to FIG. 5A, FIG. 5A is a simplified block diagram of an example of active loading mechanism 120b coupled to PCB 118 and over heat source 104i in a cold environment. In an example, heat source 104i can be on a substrate 142. Substrate 142 can be coupled to PCB 118 using solder balls 144. Secure posts 146 can couple with securing mechanisms 148 to help secure active loading mechanism 120b (and heat sink 106g) over heat source 104i. Heat sink 106g can be over heat source 104i with TIM 122 between heat sink 106g and heat source 104i. When the system is in a cold environment, gap 134 is created between heat sink 106g and TIM 122. Gap 134 helps to thermally decouple heat sink 106g from heat source 104i and thereby reduce the thermal mass of the system. This allows heat source 104i to heat up relatively quickly in the cold environment because heat sink 106g is not drawing heat or thermal energy away from heat source 104i.

Figure 5B:
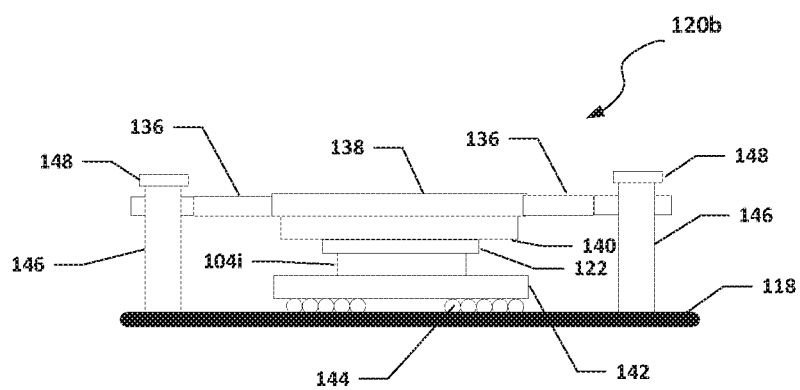
FIG. 5B is a simplified block diagram of a system to enable an active loading mechanism, in accordance with an embodiment of the present disclosure.

Turning to FIG. 5B, FIG. 5B is a simplified block diagram of an example of active loading mechanism 120b coupled to PCB 118 and over heat source 104i when the temperature of heat source 104i is above a threshold. In an example, heat source 104i can be on a substrate 142. Substrate 142 can be coupled to PCB 118 using solder balls 144. Secure posts 146 can couple with securing mechanisms 148 to help secure active loading mechanism 120b (and heat sink 106g) over heat source 104i. Heat sink 106g can be over heat source 104i with TIM 122 between heat sink 106g and heat source 104i. When the temperature is above a threshold (e.g., a minimum operating temperature of heat source 104i), a shape change of activate loading mechanism 120b is triggered.

The shape change is caused by the shape memory material in activate loading mechanism 120b that changes shape at a specific temperature (a selectable property of shape memory material). The specific temperature that activates the shape memory material can be heat from heat source 104i. As activate loading mechanism 120b attempts to revert to its programmed shape (illustrated in FIG. 4A), activate loading mechanism 120b is constrained by the attachments at secure posts 146 and draws or pulls heat sink 106g towards heat source 104i and close the gap between heat source 104i and heat sink 106g and allow heat sink 106g to couple with heat source 104i and draw heat or thermal energy from heat source 104i. When heat source 104i reenters a cold environment or a temperature of heat source 104i is below a minimum operating temperature of heat source 104i, the shape memory material can be deactivated and gap 134 can again be created to thermally decouple heat sink 106g from heat source 104i.

Figure 6A:
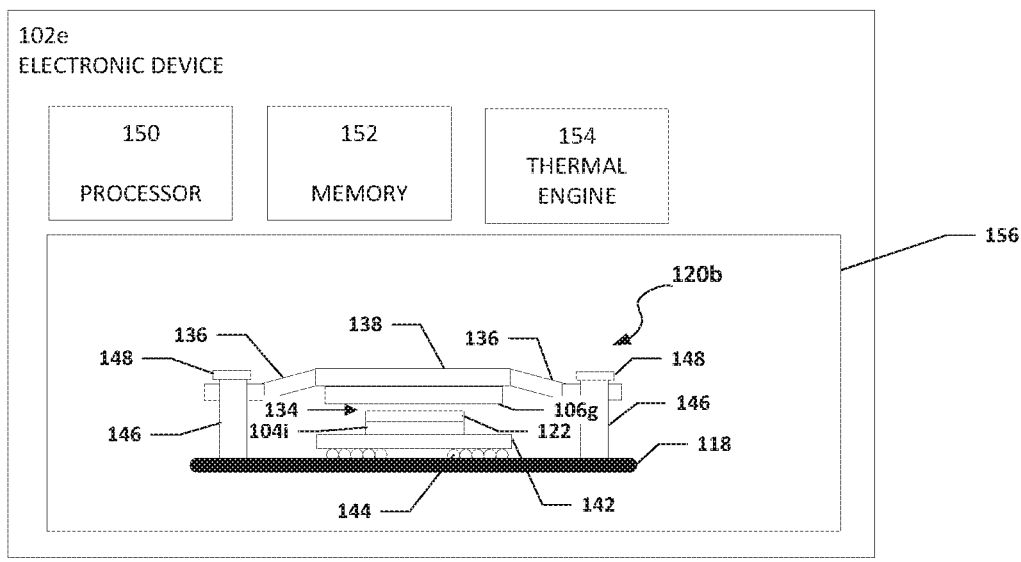
FIG. 6A is a simplified block diagram of a system to enable an active loading mechanism, in accordance with an embodiment of the present disclosure.

Turning to FIG. 6A, FIG. 6A is a simplified block diagram of an electronic device 102e. Electronic device 102e can include a processor 150, memory 152, a thermal engine 154, and one or more electronic components 156. Each electronic component 156 can include active loading mechanism 120b coupled to PCB 118 and over heat source 104i in a cold environment. In an example, heat source 104i can be on a substrate 142. Substrate 142 can be coupled to PCB 118 using solder balls 144. Secure posts 146 can couple with securing mechanisms 148 to help secure active loading mechanism 120b (and heat sink 106g) over heat source 104i. Heat sink 106g can be over heat source 104i with TIM 122 between heat sink 106g and heat source 104i. When the system is in a cold environment, gap 134 is created between heat sink 106g and TIM 122. Gap 134 helps to thermally decouple heat sink 106g from heat source 104i and thereby reduce the thermal mass of the system. This allows heat source 104i to heat up relatively quickly in the cold environment because heat sink 106g is not drawing heat or thermal energy away from heat source 104i.

Figure 6B:
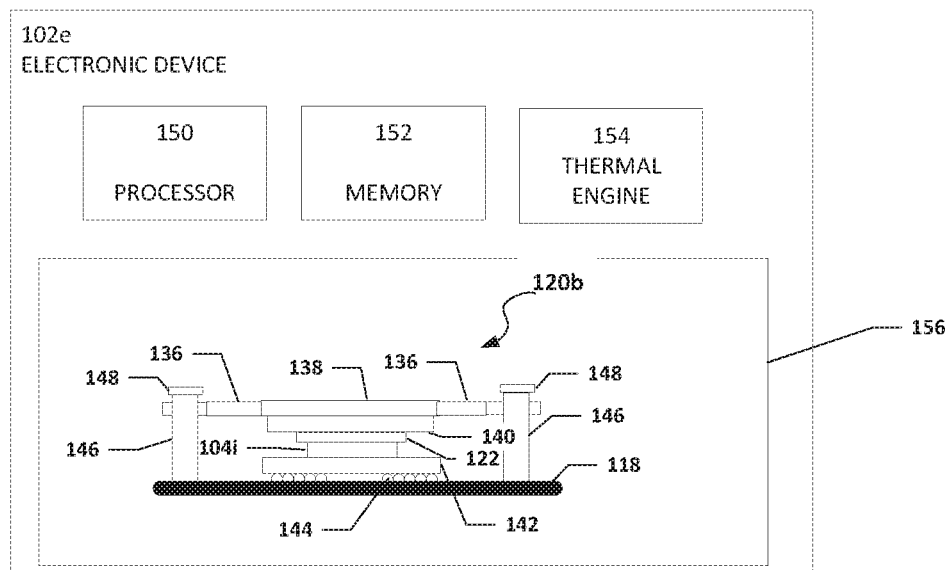
FIG. 6B is a simplified block diagram of a system to enable an active loading mechanism, in accordance with an embodiment of the present disclosure.

Turning to FIG. 6B, FIG. 6B is a simplified block diagram of electronic device 102e. Electronic device 102e can include processor 150, memory 152, thermal engine 154, and one or more electronic components 156. Each electronic component 156 can include active loading mechanism 120b coupled to PCB 118 and over heat source 104i when the temperature of heat source 104i is above a threshold. In an example, heat source 104i can be on a substrate 142. Substrate 142 can be coupled to PCB 118 using solder balls 144. Secure posts 146 can couple with securing mechanisms 148 to help secure active loading mechanism 120b (and heat sink 106g) over heat source 104i. Heat sink 106g can be over heat source 104i with TIM 122 between heat sink 106g and heat source 104i. When the temperature of heat source 104i is above a threshold, a shape change of activate loading mechanism 120b is triggered by thermal engine 154.

Figure 7A:
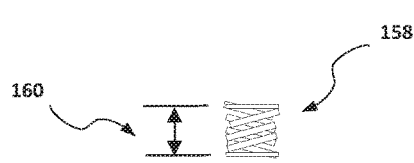
FIG. 7A is a simplified block diagram of a portion of a system to enable an active loading mechanism, in accordance with an embodiment of the present disclosure.

Turning to FIG. 7A, FIG. 7A is a simplified block diagram of memory spring 158. Memory spring 158 can have an initial height 160. Initial height 160 can be the configuration of memory spring 158 when the temperature is below a threshold temperature. Memory spring 158 can be comprised of shape memory material and may be activated by the application of heat or by the application of an electrical current (resistive heating).

Figure 7B:
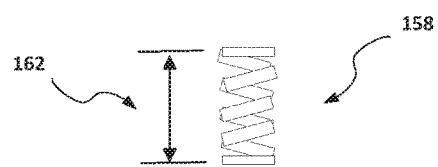
FIG. 7B is a simplified block diagram of a portion of a system to enable an active loading mechanism, in accordance with an embodiment of the present disclosure.

Turning to FIG. 7B, FIG. 7B is a simplified block diagram of memory spring 158. When heat is applied to memory spring 158, its length is expanded to expanded height 162. When the shape memory material in memory spring 158 is de-activated, memory spring 158 reverts to its initial height 160 illustrated in FIG. 8A.

Figure 7C:
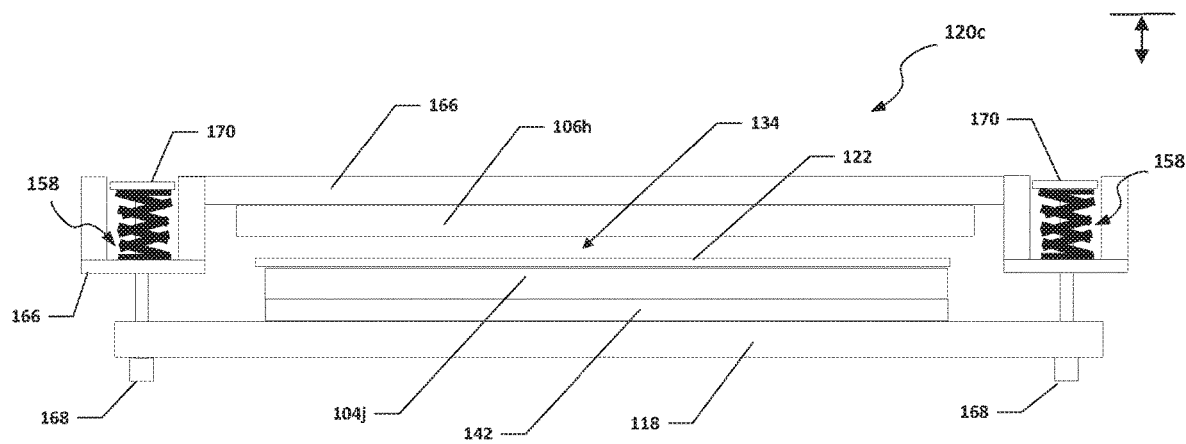
FIG. 7C is a simplified block diagram of a system to enable an active loading mechanism, in accordance with an embodiment of the present disclosure.

Turning to FIG. 7C, FIG. 7C is a simplified block diagram of memory spring 158 being used in an active loading mechanism 120c when active loading mechanism 120c is coupled to PCB 118 and over heat source 104j in a cold environment. Heat source 104i can be on a substrate 142. Substrate 142 can be coupled to PCB 118 using solder balls (not shown). Secure posts 146 can couple with securing mechanisms 148 to help secure active loading mechanism 120c (and heat sink 106g) over heat source 104j. Heat sink 106h can be over heat source 104i with TIM 122 between heat sink 106g and heat source 104j.

Figure 8A:
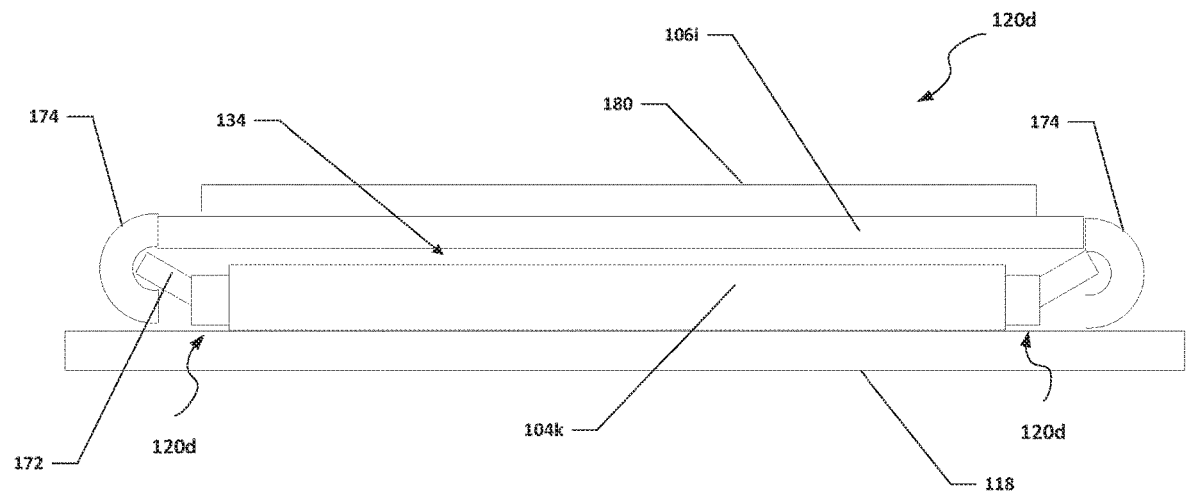
FIG. 8A is a simplified block diagram of a system to enable an active loading mechanism, in accordance with an embodiment of the present disclosure.

Active loading mechanism 120c can include a heat sink 106h and a main body 166. Active loading mechanism 120c can be secured to PCB 118 using a shoulder screw 168. Shoulder screw 168 can include a shoulder screw head 176. Memory spring 158 can be compressed (as illustrated in FIG. 8A) and positioned such that one end of memory spring 158 presses downward on main body 166 of active loading mechanism 120c and the other end of memory spring 158 presses upward on shoulder screw head 170. When the system is in a cold environment, gap 134 is created between heat sink 106*h* and TIM 122. Gap 134 helps to thermally decouple heat sink 106*h* from heat source 104*j* and thereby reduce the thermal mass of the system. This allows heat source 104*j* to heat up relatively quickly because heat sink 106*h* is not drawing heat or thermal energy away from heat source 104*j*.

Figure 7D:
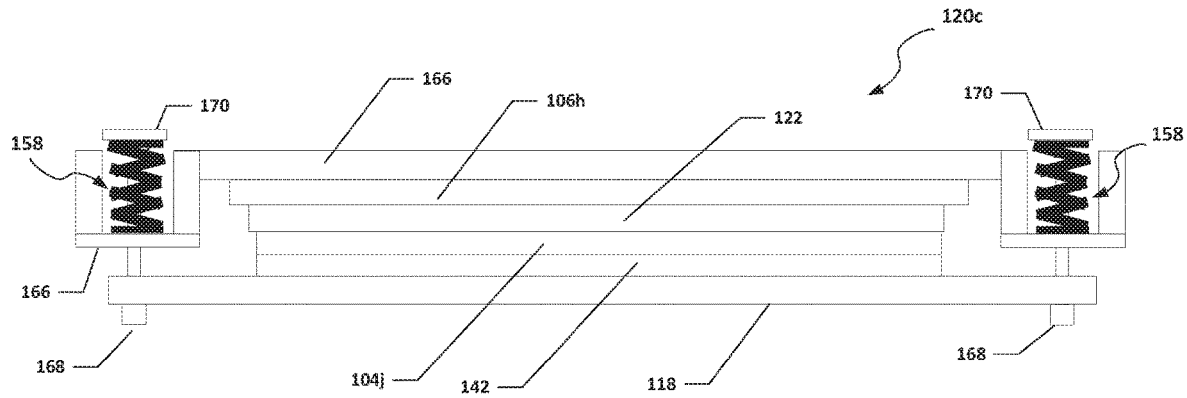
FIG. 7D is a simplified block diagram of a system to enable an active loading mechanism, in accordance with an embodiment of the present disclosure.

Turning to FIG. 7D, FIG. 7D is a simplified block diagram of memory spring 158 being used in an active loading mechanism 120*c* when active loading mechanism 120*c* is coupled to PCB 118 over heat source 104*j* and the temperature is above a threshold temperature. Heat source 104*j* can be on a substrate 142. Substrate 142 can be coupled to PCB 118 using solder balls (not shown). Secure posts 146 can couple with securing mechanisms 148 to help secure active loading mechanism 120*c* (and heat sink 106*g*) over heat source 104*j*. Heat sink 106*h* can be over heat source 104*j* with TIM 122 between heat sink 106*g* and heat source 104*i*.

Active loading mechanism 120*c* can include a heat sink 106*h* and a main body 166. Active loading mechanism 120*c* can be secured to PCB 118 using a shoulder screw 168. Shoulder screw 168 can include a shoulder screw head 176. Memory spring 158 can be compressed (as illustrated in FIG. 7A) and positioned such that one end of memory spring 158 presses downward on main body 166 of active loading mechanism 120*c* and the other end of memory spring 158 presses upward on shoulder screw head 170. In an example, the shape memory material in memory spring 158 can be activated by the application of heat from heat source 104*j* or by the application of an electrical current and upon activation. When the shape memory material in memory spring 158 is activated, memory spring 158 attempts to revert to its expanded height 162 (as illustrated in FIG. 7B). Because memory spring 158 is compressed between main body 166 of active loading mechanism 120*c* and shoulder screw head 176, the force of memory spring 158 attempting to revert to its expanded height 162 pushes or forces heat sink 106*h* towards heat source 104*j* and closes the gap between heat source 104*j* and heat sink 106*h* and allows heat sink 106*h* to couple with heat source 104*j* and draw heat or thermal energy from heat source 104*j*. When heat source 104*j* reenters a cold environment or a temperature of heat source 104*j* is below a minimum operating temperature of heat source 104*j*, the shape memory material in memory spring 158 can be deactivated and gap 134 can again be created.

Turning to FIG. 8A, FIG. 8A is a simplified block diagram of an active loading mechanism 120*d* when heat sink 106*i* is over heat source 104*k* in a cold environment. Heat source 104*k* can be over PCB 118. In an example, active loading mechanism 120*d* can include heat sink securing mechanism 172. Heat sink 106*i* can include one or more curved or hooked ends 174. In an example, a heat pipe 180 may be coupled to or positioned over heat sink 106*i*. Heat pipe 180 may be an active heat pipe or a passive heat pipe. As illustrated in FIG. 8A, in a cold environment, heat sink 106*i* can be positioned over heat source 104*k* and active loading mechanism 120*d* such that heat sink securing mechanism 172 of active loading mechanism 120*d* is inside curved or hooked end 174 of heat sink 106*i*. In an example, a TIM layer (e.g., TIM 122) can be over heat source 104*k*. When the system is in a cold environment, gap 134 is created between heat sink 106*i* and heat source 104*k*. Gap 134 helps to thermally decouple heat sink 106*i* from heat source 104*k* and thereby reduce the thermal mass of the system. This allows heat source 104*k* to heat up relatively quickly because heat sink 106*i* is not drawing heat or thermal energy away from heat source 104*k*.

Figure 8B:
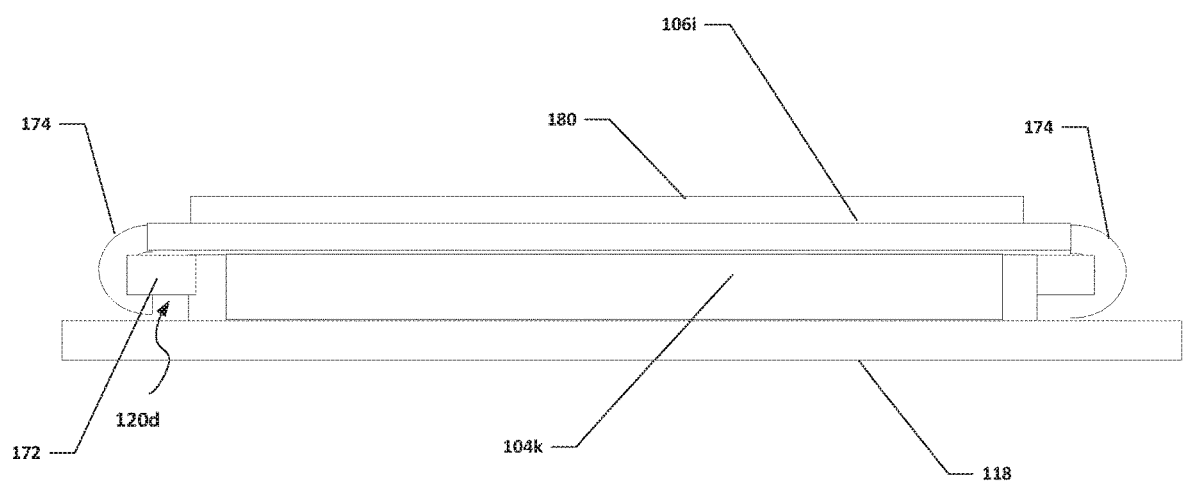
FIG. 8B is a simplified block diagram of a system to enable an active loading mechanism, in accordance with an embodiment of the present disclosure.

Turning to FIG. 8B, FIG. 8B is a simplified block diagram of an active loading mechanism 120*d* when heat sink 106*i* is over heat source 104*k* and the temperature is above a threshold temperature. When the temperature is above a threshold, heat sink securing mechanism 172 is activated. Heat sink securing mechanism 172 can be activated either by application of heat from heat source 104*k* or by application of an electrical current (resistive heating). The activation of heat sink securing mechanism 172 causes heat sink securing mechanism 172 to pull heat sink 106*i* downward onto heat source 104*k* and closes the gap between heat source 104*k* and heat sink 106*i* and allows heat sink 106*i* to couple with heat source 104*k* and draw heat or thermal energy from heat source 104*k*. When heat source 104*k* reenters a cold environment or a temperature of heat source 104*k* is below a minimum operating temperature of heat source 104*k*, heat sink securing mechanism 172 can be deactivated and gap 134 can again be created.

Figure 9A:
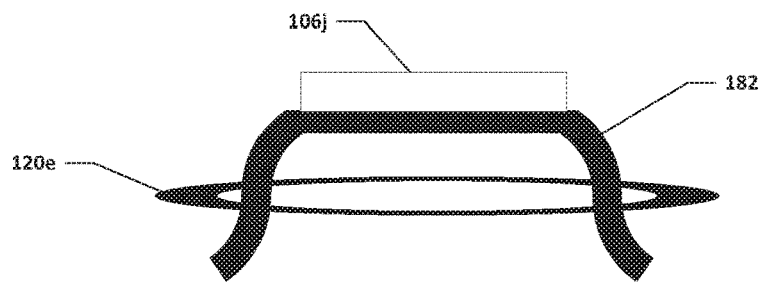
FIG. 9A is a simplified block diagram of a portion of a system to enable an active loading mechanism, in accordance with an embodiment of the present disclosure.

Turning to FIG. 9A, FIG. 9A is a simplified block diagram of an active loading mechanism 120*e* coupled to a heat sink 106*j* when heat sink 106*j* is over heat source 104*l* in a cold environment. In an example, heat sink 106*j* can include attachment means 182, which can consist of various geometries (e.g., rim, ledge, lip, arms, clips, teeth, etc.). Active loading mechanism 120*e* can be configured to extend around attachment means 182.

Figure 9B:
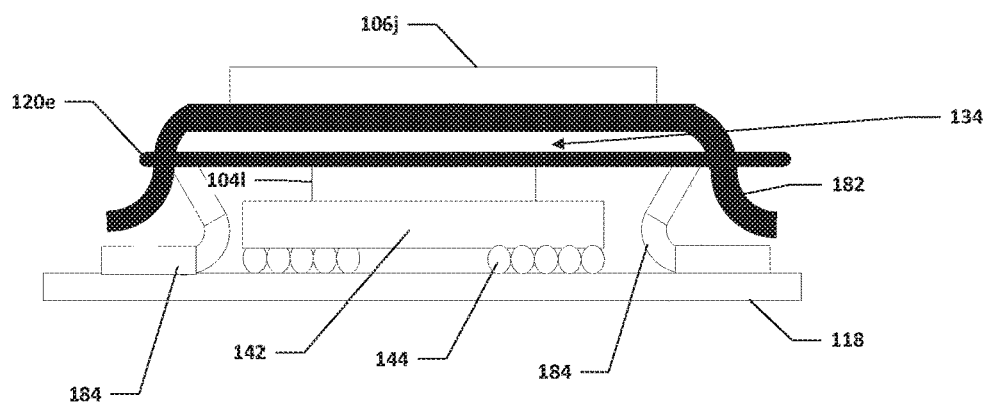
FIG. 9B is a simplified block diagram of a system to enable an active loading mechanism, in accordance with an embodiment of the present disclosure.

Turning to FIG. 9B, FIG. 9B is a simplified block diagram of active loading mechanism 120*e* coupled to heat sink 106*j* when heat sink 106*j* is over heat source 104*l* in a cold environment. In an example, active loading mechanism 120*e* and heat sink 106*j* can be positioned over heat source 104*l*. Heat source 104*l* can be over substrate 142. Substrate 142 can be over PCB 118 and coupled to PCB 118 with solder balls 144. PCB 118 can include PCB attachment means 184. Attachment means 182 can be configured to be lowered over PCB attachment means 184, which similarly can consist of various geometries (e.g., ring, clip, posts, ledge, lip, arm, teeth, etc.). When the system is in a cold environment, gap 134 is created between heat sink 106*j* and heat source 104*l*. Gap 134 helps to thermally decouple heat sink 106*j* from heat source 104*l* and thereby reduce the thermal mass of the system. This allows heat source 104*l* to heat up relatively quickly because heat sink 106*j* is not drawing heat or thermal energy away from heat source 104*l*.

Figure 9C:
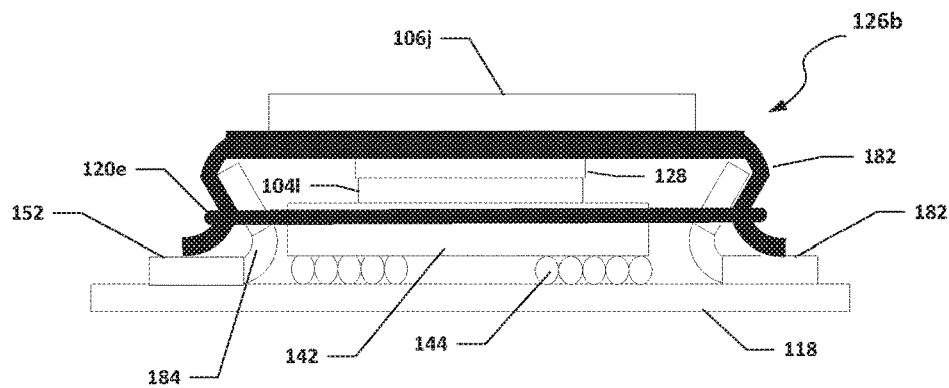
FIG. 9C is a simplified block diagram of a system to enable an active loading mechanism, in accordance with an embodiment of the present disclosure.

Turning to FIG. 9C, FIG. 9C is a simplified block diagram of active loading mechanism 120*e* coupled to heat sink 106*j* when heat sink 106*j* is over heat source 104*l* and the temperature is above a threshold temperature. In an example, when the temperature is above a threshold, active loading mechanism 120*e* is activated. When active loading mechanism 120*e* is activated, due to the interaction between the sloped or cammed faces of attachment means 182 and PCB attachment means 184, activate loading mechanism 120*e* pulls attachment means 182 into PCB attachment means 184 and causes a force to push heat sink 106*j* onto heat source 104*l*. Active loading mechanism 120*e* can be activated either by application of heat from heat source 104*l* or by application of an electrical current (resistive heating). The activation of active loading mechanism 120*e* pulls heat sink 106*j* downward onto heat source 104*l* and closes the gap between heat source 104*l* and heat sink 106*j* and allows heat sink 106*j* to couple with heat source 104*l* and draw heat or thermal energy from heat source 104*l*. When heat source 104*l* reenters a cold environment or a temperature of heat source 104*l* is below a minimum operating temperature of heat source 104*l*, active loading mechanism 120*e* can be deactivated and gap 134 can again be created.

Figure 10:
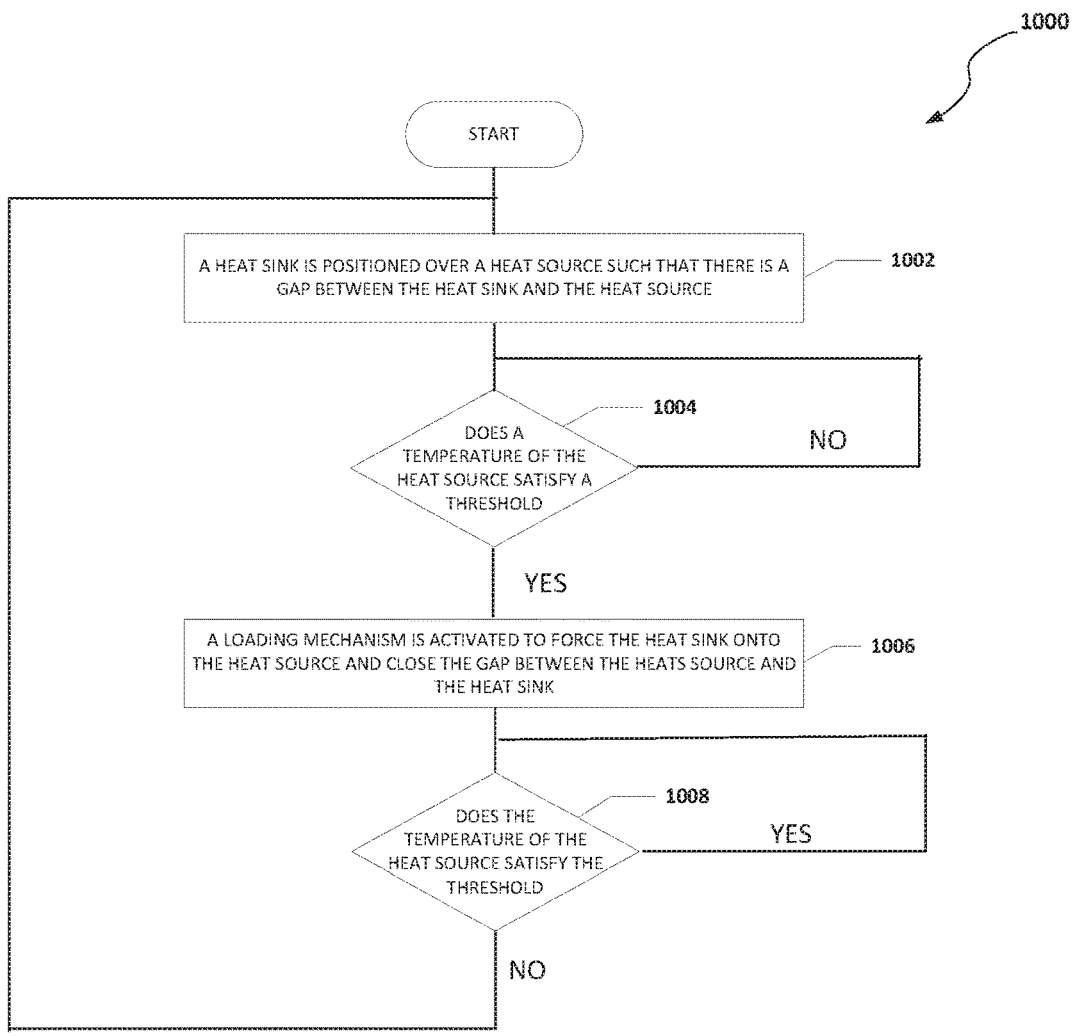
FIG. 10 is a simplified flowchart illustrating potential operations that may be associated with the system in accordance with an embodiment.

Turning to FIG. 10, FIG. 10 is an example flowchart illustrating possible operations of a flow 1000 that may be associated with a heat activated loading mechanism, in accordance with an embodiment. At 1002, a heat sink is positioned over a heat source such that there is a gap between the heat sink and the heat source. The gap helps to thermally decouple the heat sink from the heat source and reduce the thermal mass of the heat source. This allows the heat source to heat up relatively quickly because the heat sink is not drawing heat or thermal energy away from the heat source. At 1004, the system determines if a temperature of the heat source satisfies a threshold. The threshold can be system dependent and may be the lowest operating temperature of the heat source (e.g., zero degrees Celsius or some other threshold operating temperature of the heat source). If the system determines the temperature of the heat source does not satisfy the threshold, then the system returns to 1004 and again determines if the temperature of the heat source satisfies the threshold. If the system determines the temperature of the heat source satisfies the threshold, then a loading mechanism is activated to force the heat sink onto the heat source and close the gap between the heat source and the heat sink and allow the heat sink to couple with the heat source and draw heat or thermal energy from the heat source, as in 1006. In an example, a temperature of the shape memory material passively determines if a temperature of the heat source satisfies a threshold (e.g., the shape memory material does not activate until the shape memory material reaches the threshold temperature and the shape change starts at the $A_s$ temperature and is completed at the $A_F$ or "transition" temperature). In another example, a thermal engine (e.g., thermal engine 154) determines if a temperature of the heat source satisfies a threshold. At 1008, the system again determines if the temperature of the heat source satisfies the threshold. If the system determines the temperature of the heat source satisfies the threshold, then the system returns to 1008 and again determines if the temperature of the heat source satisfies the threshold. If the system determined that the temperature of the heat source does not satisfy the threshold, then the heat sink is positioned over a heat source such that there is a gap between the heat sink and the heat source, as in 1002.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 102a-102d have been illustrated with reference to particular elements and operations, these elements and operations may be replaced by any suitable architecture, protocols, and/or processes that achieve the intended functionality of electronic devices 102a-102d.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, an electronic device can include a heat source, a heat sink over the heat source, and an active loading mechanism coupled to the heat sink, where the heat sink is thermally decoupled from the heat source when the active loading mechanism is not activated and the heat sink is thermally coupled to the heat source when the active loading mechanism is activated.

In Example A2, the subject matter of Example A1 can optionally include where when the active loading mechanism is not activated, there is a gap between the heat source and the heat sink.

In Example A3, the subject matter of any one of Examples A1-A2 can optionally where the active loading mechanism is activated when a temperature of the heat source satisfies a threshold temperature.

In Example A4, the subject matter of any one of Examples A1-A3 can optionally include where the threshold temperature is above a minimum operating temperature of the heat source.

In Example A5, the subject matter of any one of Examples A1-A4 can optionally include where the active loading mechanism is activated by resistive heating from an electrical current.

In Example A6, the subject matter of any one of Examples A1-A5 can optionally include where the active loading mechanism includes shape memory material.

In Example A7, the subject matter of any one of Examples A1-A6 can optionally include where the shape memory material is a Nickel-Titanium alloy.

Example M1 is a method including determining if a temperature of a heat source satisfies a threshold, where the heat source is thermally decoupled from a heat sink and activating an active loading mechanism when the temperature of the heat source satisfies the threshold, where the active loading mechanism is coupled to the heat sink and when the active loading mechanism is activated, the heat sink is thermally coupled to the heat source.

In Example M2, the subject matter of Example M1 can optionally include where.

In Example M3, the subject matter of any one of the Examples M1-M2 can optionally include where a gap between the heat source and the heat sink is created when the heat source is thermally decoupled from the heat sink.

In Example M4, the subject matter of any one of the Examples M1-M3 can optionally include where the gap is greater than about 0.5 millimeters.

In Example M5, the subject matter of any one of the Examples M1-M4 can optionally include deactivating the active loading mechanism to thermally decouple the heat source and the heat sink when the temperature of the heat source does not satisfy the threshold.

In Example M6, the subject matter of any one of the Examples M1-M5 can optionally include where the active loading mechanism is activated by heat from the heat source.

In Example M7, the subject matter of any one of the Examples M1-M6 can optionally include where the active loading mechanism is activated when a temperature of the heat source satisfies a threshold temperature.

In Example M8, the subject matter of any one of the Examples M1-M7 can optionally include where the threshold temperature is above a minimum operating temperature of the heat source.

Example AA1 is an active loading mechanism. The active loading mechanism can include shape memory material, a heat sink over a heat source, and a securing mechanism, where the securing mechanism secures the active loading mechanism to a printed circuit board, where the heat sink is thermally decoupled from the heat source when the shape memory material is not activated and the heat sink is thermally coupled to the heat source when the shape memory material is activated.

In Example AA2, the subject matter of Example AA1 can optionally include where when the shape memory material is not activated, a gap between the heat source and the heat sink is created.

In Example AA3, the subject matter of any one of the Examples AA1-AA2 can optionally include where the gap is greater than about 0.5 millimeters.

In Example AA4, the subject matter of any one of the Examples AA1-AA3 can optionally include where the active loading mechanism is activated when a temperature of the heat source satisfies a threshold temperature.

In Example AA5, the subject matter of any one of the Examples AA1-AA4 can optionally include where the threshold temperature is above a minimum operating temperature of the heat source.

In Example AA6, the subject matter of any one of Examples AA1-AA6 can optionally include where the shape memory material is a Nickel-Titanium alloy.

What is claimed is:

1. An electronic device comprising: a heat source; a heat sink over the heat source; and an active loading mechanism coupled to the heat sink, wherein the active loading mechanism includes arms that extend from the heat sink, wherein the arms includes shape memory material and the arms are biased to generate a force away from the heat source when the active loading mechanism is not activated, wherein the heat sink is thermally decoupled from the heat source when the active loading mechanism is not activated and the heat sink is thermally coupled to the heat source when the active loading mechanism is activated.

2. The electronic device of claim 1, wherein when the active loading mechanism is not activated, there is a gap between the heat source and the heat sink.

3. The electronic device of claim 1, wherein the active loading mechanism is activated when a temperature of the heat source satisfies a threshold temperature.

4. The electronic device of claim 3, wherein the threshold temperature is above a minimum operating temperature of the heat source.

5. The electronic device of claim 1, wherein the active loading mechanism is activated by resistive heating from an electrical current.

6. The electronic device of claim 1, wherein the shape memory material is a Nickel-Titanium alloy.

7. A method comprising: determining if a temperature of a heat source satisfies a threshold, wherein the heat source is thermally decoupled from a heat sink; and activating an active loading mechanism when the temperature of the heat source satisfies the threshold, wherein the active loading mechanism includes arms that extend from the heat sink, wherein the arms includes shape memory material and the arms are biased to generate a force away from the heat source when the active loading mechanism is not activated, wherein the heat sink is thermally decoupled from the heat source when the active loading mechanism is not activated is coupled to the heat sink and when the active loading mechanism is activated, and when the active loading mechanism is activated, the heatsink is thermally coupled to the heat source.

8. The method of claim 7, wherein a gap between the heat source and the heat sink is created when the heat source is thermally decoupled from the heat sink.

9. The method of claim 8, wherein the gap is greater than about 0.5 millimeters.

10. The method of claim 7, further comprising:
deactivating the active loading mechanism to thermally decouple the heat source and the heat sink when the temperature of the heat source does not satisfy the threshold.

11. The method of claim 7, wherein the active loading mechanism is activated by heat from the heat source.

12. The method of claim 7, wherein the active loading mechanism is activated when a temperature of the heat source satisfies a threshold temperature.

13. The method of claim 12, wherein the threshold temperature is above a minimum operating temperature of the heat source.

14. An active loading mechanism comprising:
arms that include shape memory material;
a heat sink over a heat source; and
a securing mechanism, wherein the securing mechanism secures the active loading mechanism to a printed circuit board, wherein the heat sink is thermally decoupled from the heat source when the shape memory material is not activated and the heat sink is thermally coupled to the heat source when the shape memory material is activated, wherein the arms extend from the heat sink to the securing mechanism and are biased to generate a force away from the heat source when the active loading mechanism is not activated.

15. The active loading mechanism of claim 14, wherein when the shape memory material is not activated, a gap between the heat source and the heat sink is created.

16. The active loading mechanism of claim 15, wherein the gap is greater than about 0.5 millimeters.

17. The active loading mechanism of claim 14, wherein the active loading mechanism is activated when a temperature of the heat source satisfies a threshold temperature.

18. The active loading mechanism of claim 17, wherein the threshold temperature is above a minimum operating temperature of the heat source.

19. The active loading mechanism of claim 14, wherein the shape memory material is a Nickel-Titanium alloy.

* * * * *

UNITED STATES PATENT AND TRADEMARK OFFICE
CERTIFICATE OF CORRECTION

PATENT NO. : 11,019,751 B2
APPLICATION NO. : 16/832576
DATED : May 25, 2021
INVENTOR(S) : Iwan Ricardo Grau et al.

Page 1 of 1

It is certified that error appears in the above-identified patent and that said Letters Patent is hereby corrected as shown below:

In the Claims

In Column 20, Claim 7, Line 11, delete "heatsink" and insert -- heat sink --, therefor.

Signed and Sealed this
Third Day of August, 2021

Drew Hirshfeld
*Performing the Functions and Duties of the*
*Under Secretary of Commerce for Intellectual Property and*
*Director of the United States Patent and Trademark Office*